(12) United States Patent
Collins et al.

(10) Patent No.: US 7,968,975 B2
(45) Date of Patent: Jun. 28, 2011

(54) METAL WIRING STRUCTURE FOR INTEGRATION WITH THROUGH SUBSTRATE VIAS

(75) Inventors: David S. Collins, Williston, VT (US); Alvin Joseph, Williston, VT (US); Peter J. Lindgren, Essex Junction, VT (US); Anthony K. Stamper, Williston, VT (US); Kimball M. Watson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 245 days.

(21) Appl. No.: 12/188,234

(22) Filed: Aug. 8, 2008

(65) Prior Publication Data

US 2010/0032809 A1 Feb. 11, 2010

(51) Int. Cl.
*H01L 29/40* (2006.01)
*H01L 21/44* (2006.01)

(52) U.S. Cl. ......... 257/621; 257/E23.174; 257/E21.597; 438/667

(58) Field of Classification Search .................. 257/621, 257/E23.174, E21.597; 438/667
See application file for complete search history.

(56) References Cited

U.S. PATENT DOCUMENTS

| | | | |
|---|---|---|---|
| 5,581,097 A | 12/1996 | Nariishi | |
| 5,700,735 A | 12/1997 | Shiue et al. | |
| 5,977,599 A | 11/1999 | Adrian | |
| 6,043,164 A | 3/2000 | Nguyen et al. | |
| 6,362,528 B2 | 3/2002 | Anand | |
| 6,555,946 B1 | 4/2003 | Finder et al. | |
| 6,566,733 B1 | 5/2003 | Husher et al. | |
| 6,798,041 B1 | 9/2004 | Husher | |
| 6,836,398 B1 | 12/2004 | Subramanian et al. | |
| 6,921,976 B2 | 7/2005 | Yamashita | |
| 7,030,492 B2 | 4/2006 | Huang | |
| 7,060,634 B2 | 6/2006 | Rantala et al. | |
| 7,098,113 B1 | 8/2006 | Husher et al. | |
| 7,144,827 B2 | 12/2006 | Rantala et al. | |
| 7,160,805 B1 | 1/2007 | Burke et al. | |
| 7,189,595 B2 | 3/2007 | Magerlein et al. | |
| 7,271,084 B2 | 9/2007 | Jeong et al. | |

(Continued)

OTHER PUBLICATIONS

U.S. Appl. No. 11/328,939 entitled "Method and System of Using Artifacts to Identify Elements of a Component Businness Model", filed on Jan. 10, 2006, First Named Inventor: David Bernard Flaxer.

(Continued)

*Primary Examiner* — Kiesha R Bryant
*Assistant Examiner* — Tucker Wright
(74) *Attorney, Agent, or Firm* — Scully, Scott, Murphy & Presser, P.C.; H. Daniel Schnurmann

(57) ABSTRACT

An array of through substrate vias (TSVs) is formed through a semiconductor substrate and a contact-via-level dielectric layer thereupon. A metal-wire-level dielectric layer and a line-level metal wiring structure embedded therein are formed directly on the contact-via-level dielectric layer. The line-level metal wiring structure includes cheesing holes that are filled with isolated portions of the metal-wire-level dielectric layer. In one embodiment, the entirety of the cheesing holes is located outside the area of the array of the TSVs to maximize the contact area between the TSVs and the line-level metal wiring structure. In another embodiment, a set of cheesing holes overlying an entirety of seams in the array of TSVs is formed to prevent trapping of any plating solution in the seams of the TSVs during plating to prevent corrosion of the TSVs at the seams.

25 Claims, 13 Drawing Sheets

U.S. PATENT DOCUMENTS

| | | |
|---|---|---|
| 7,315,072 B2 | 1/2008 | Watanabe |
| 7,372,158 B2 | 5/2008 | Wang et al. |
| 2006/0027933 A1 | 2/2006 | Chen et al. |
| 2008/0067688 A1 | 3/2008 | Gratz et al. |
| 2008/0157379 A1 | 7/2008 | Choi |

OTHER PUBLICATIONS

International Search Report dated Sep. 22, 2009.

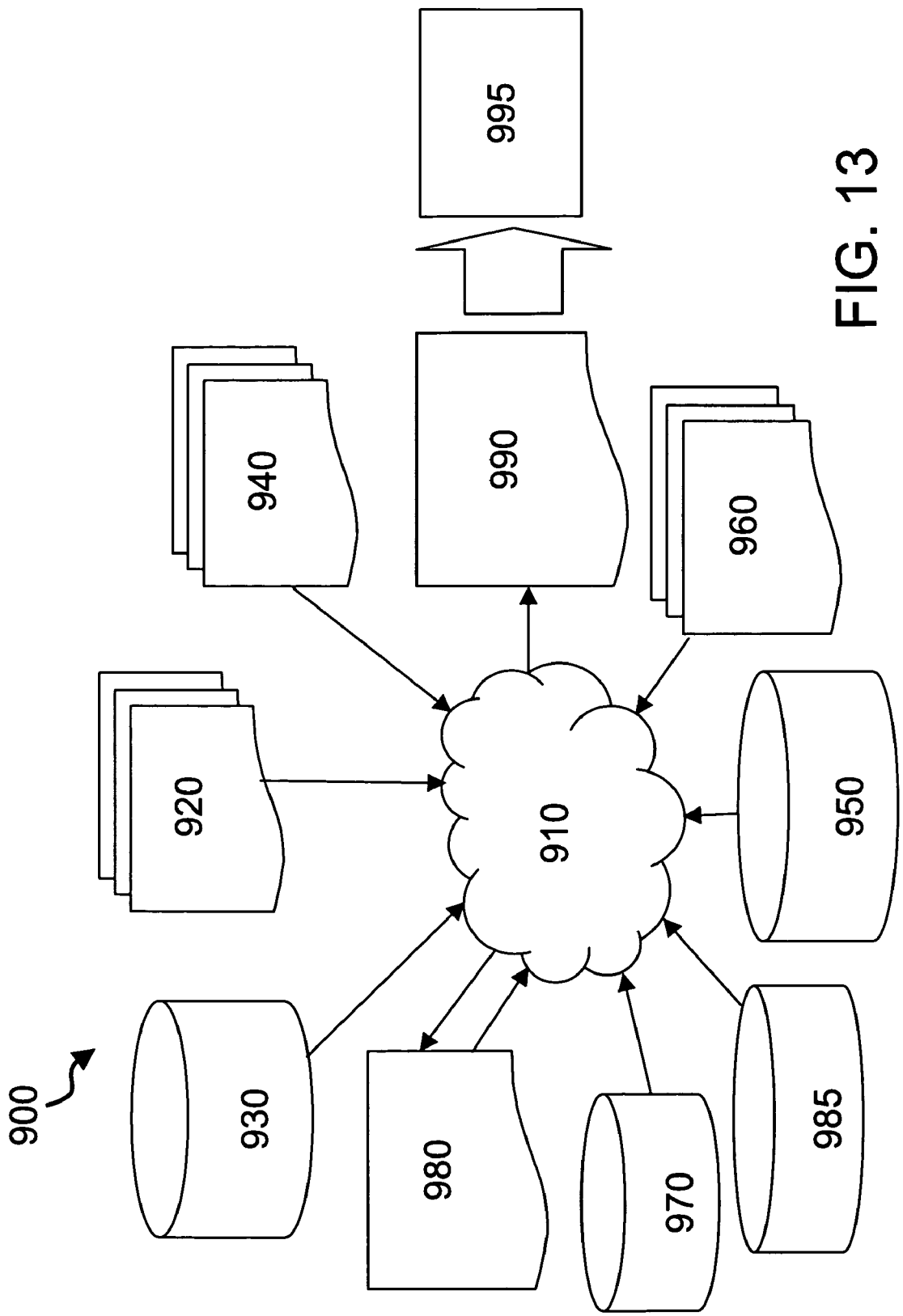

METAL WIRING STRUCTURE FOR INTEGRATION WITH THROUGH SUBSTRATE VIAS

FIELD OF THE INVENTION

The present invention relates to semiconductor structures, and particularly to semiconductor structures including a line-level metal wiring structure and through substrate vias, methods of manufacturing the same, and design structures for the same.

BACKGROUND OF THE INVENTION

As continued semiconductor scaling faces difficulties at device dimensions approaching atomic scale, three-dimensional device integration offers a method of increasing semiconductor devices within a circuit. In three-dimensional integration, a plurality of semiconductor chips is vertically stacked to provide integration of semiconductor devices beyond a single semiconductor chip.

One method of providing electrical connection between adjoining semiconductor chips is "flip chip" technology in which an array of solder balls are employed between two adjoined semiconductor chips that are vertically stacked face to face. However, flip chip technology provides electrical connection between only two vertically stacked semiconductor chip.

Another method of providing electric connection between a plurality of semiconductor chips employs through substrate vias (TSVs) that are formed through the substrate of a semiconductor chip. Typically, the TSVs extend from a line-level metal wiring structure, which is typically a first metal wiring level in a metal interconnect structure, to a bottom surface of a semiconductor chip. In conjunction with an array of solder balls, such as C4 balls, formed on top of the metal interconnect structure above the semiconductor substrate, the TSVs provide an electrical connection path through the semiconductor chip. Unlike flip chip technology, more than two semiconductor chips may be vertically stacked employing the TSVs and arrays of solder balls.

Referring to FIG. 1, a vertical cross-sectional view of a prior art semiconductor chip shows a semiconductor substrate 10 and a metal interconnect structure 90 formed thereupon. The semiconductor substrate 10 includes a semiconductor layer 12 comprising a semiconductor material. Semiconductor device regions 14 including various semiconductor devices are formed in upper portions of the semiconductor substrate 10 by method known in the art.

The various semiconductor devices in the semiconductor device regions 14 are electrically connected within the semiconductor chip employing substrate level contact vias 70 and line-level metal wiring structures 80 that are formed within a back-end-of-line (BEOL) dielectric layer 55 formed directly on the semiconductor substrate 10.

Electrical connection between the line-level metal wiring structures 80 and the bottom surface of the semiconductor substrate 10 is provided by through substrate vias (TSVs) 20, which extend from a bottom surface of the line-level metal wiring structures 80 to the bottom surface of the semiconductor substrate 10. Each of the TSVs 20 are formed through the entire thickness of the semiconductor substrate 10, hence the name "through substrate vias."

To form the TSVs 20, a lower portion of the BEOL dielectric layer 55 is deposited on the semiconductor substrate 10, followed by patterning of through substrate trenches in the lower portion of the BEOL dielectric layer 55 and the entire thickness of the semiconductor substrate 10, as well as via holes in the lower portion of the BEOL dielectric layer 55 extending to semiconductor devices on the top surface of the semiconductor device regions 14. The through substrate trenches are filled with a conductive material such as tungsten and planarized to form the TSVs 20. The via holes are also filled to form the substrate level contact vias 70.

An upper portion of the BEOL dielectric layer 55 is thereafter deposited on the lower portion of the BEOL dielectric layer 55. Patterned areas of the upper portion of the BEOL dielectric layer 55 are recessed and filled with metal by plating. The plated metal is planarized to form the line-level metal wiring structures 80.

A horizontal cross-sectional view of a portion of the prior art semiconductor chip in FIG. 1 along the plane X-X' is shown in FIG. 2, which shows cheesing holes formed in a line-level metal wiring structures 80. The cheesing holes, which have a square shape, are filled with the dielectric material of the BEOL dielectric layer 55. Formation of the cheesing holes is effected by preventing recessing of a plurality of isolated square areas within a large recessed area during the patterning of the upper portion of the BEOL dielectric layer 55, thereby placing isolated portions of the BEOL dielectric layer 55 with the line-level metal wiring structures 80. The resulting line-level metal wiring structures 80 contain square areas containing an insulator material, i.e., the material of the BEOL dielectric layer 55, thereby forming a pattern of cheesing holes.

The cheesing holes are necessary to prevent "dishing" of a large metal area during chemical mechanical planarization (CMP), in which a center portion of a large area metal structure becomes thinner relative to the thickness of small area metal structures interspersed with an insulator material, i.e., the material of the BEOL dielectric layer 55. The placement of the cheesing holes prevents such dishing during CMP. To maximize the effect of the cheesing holes for preventing dishing, the cheesing holes are randomly scattered throughout the entirety of a large contiguous metal area irrespective of the pattern of any structure located underneath or above.

Some of the cheesing holes thus overlap with the TSVs 20, thereby reducing the contact area between the TSVs 20 and the line-level metal wiring structures 80. Since only a fraction of the contact area between the TSVs 20 and the line-level metal wiring structures 80 is available for current conduction, the current carrying capability through the TSVs 20 is limited by the overlap area between the TSVs 20 and the line-level metal wiring structures 80. The limited current carrying capability adversely impacts the performance of the prior art semiconductor chip.

Furthermore, one of the difficulties of the prior art semiconductor chip is that a seam 19 is formed at the center of a top surface of each TSV 20. Formation of the seam 19 is an inherent consequence of the method employed to form the TSVs 20 since the conductive material is deposited on the sidewalls of the through substrate trench first, and the center portion of each TSV 20 is filled last so that a seam extends along the center of each TSV 20 through the entire height of the TSV 20, i.e., from the top surface of each TSV 20 to the bottom surface of the TSV 20 that is substantially coplanar with the bottom surface of the semiconductor substrate 10.

The seams 19 at the center of the top surface of the TSVs 20 may have an adverse, and potentially devastating, effect on the structural integrity and reliability of the TSVs 20 since a plating solution may flow through the seam 19 during a plating process that forms the line-level metal wiring structures 80, which typically comprise copper, and kept within the volume of the seams 19 even after the plating processing step.

The residual plating solution in the seams 19 may induce slow corrosion of the TSVs 20 so that the resistance of the TSVs 20 increases in time.

FIG. 2 also shows the locations of TSVs 20 that underlie the line-level metal wiring structures 80 in thick dotted lines and the locations of the seams 19 within each of the TSVs 20 in thin dotted lines. Since the prior art semiconductor chip is formed without regard to the relative location of the cheesing holes, which is represented by the square areas filled with the material of the BEOL dielectric layer 55, and the TSVs 20 or the seams 19 in each of the TSVs 20, a significant portion of the seams 19 directly underlies the BEOL dielectric layer 55. During a plating process, therefore, the plating solution flows into the exposed portions of the seams 19. As discussed above, the plating solution is trapped in the seams 19 of the TSVs 20, and causes degradation of performance and/or reliability problem of the TSVs 20 during the lifetime of the semiconductor chip.

In view of the above, there exists a need for a semiconductor structure that enhances performance and reliability of through substrate vias (TSVs) in a semiconductor substrate.

SUMMARY OF THE INVENTION

To address the needs described above, the present invention provides a semiconductor structure including an array of through substrate vias and a line-level metal wiring structure overlying the array and providing increased current carrying capability over prior art structures and/or providing enhanced reliability, methods of manufacturing the same, and a design structure for the same.

In the present invention, an array of through substrate vias (TSVs) is formed through a semiconductor substrate and a contact-via-level dielectric layer thereupon. A metal-wire-level dielectric layer and a line-level metal wiring structure embedded therein are formed directly on the contact-via-level dielectric layer. The line-level metal wiring structure includes cheesing holes that are filled with isolated portions of the metal-wire-level dielectric layer. In one embodiment, the entirety of the cheesing holes is located outside the area of the array of the TSVs to maximize the contact area between the TSVs and the line-level metal wiring structure. In another embodiment, a set of cheesing holes overlying an entirety of seams in the array of TSVs is formed to prevent trapping of any plating solution in the seams of the TSVs during plating to prevent corrosion of the TSVs at the seams.

According to an aspect of the present invention, a semiconductor structure is provided, which comprises:

at least one through substrate via (TSV) extending through a semiconductor substrate; and at least one line-level metal wiring structure including an array of cheesing holes and vertically abutting the at least one TSV; and a metal-wire-level dielectric layer laterally abutting the at least one line-level metal wiring structure, wherein the at least one line-level metal wiring structure and the metal-wire-level dielectric layer complementarily fills an entirety of a layer located on the at least one TSV, and wherein an entirety of sidewalls of the at least one TSV abuts the at least one line-level metal wiring structure.

In one embodiment, the entirety of sidewalls of the at least one TSV is disjoined from the metal-wire-level dielectric layer.

In another embodiment, wherein each of the at least one TSV includes a seam located at a center portion of a top surface thereof, wherein the at least one line-level metal wiring structure abuts a peripheral portion of a top surface of each of the at least one TSV, and wherein the array of cheesing holes overlies an entirety of the at least one seam.

In even another embodiment, the at least one line-level metal wiring structure includes another array of cheesing holes embedding an isolated portion of the metal-wire-level dielectric layer and separated from the at least one TSV.

In yet another embodiment, the semiconductor structure further comprises a contact-via-level dielectric layer, wherein a bottom surface of the contact-via-level dielectric layer vertically abuts a top surface of the semiconductor substrate, and wherein each of the at least one TSV extends from a top surface of the contact-via-level dielectric layer to a bottom surface of the semiconductor substrate. The semiconductor structure may further comprise:

at least one semiconductor device located in the semiconductor substrate; and at least one substrate contact via embedded in the contact-via-level dielectric layer and vertically abutting the at least one semiconductor device and one of the at least one line-level metal wiring structure.

In still another embodiment, the at least one TSV is an array of through substrate vias (TSVs), wherein each cheesing hole in the array of cheesing holes embeds an isolated portion of the metal-wire-level dielectric layer, and wherein the at least one line-level metal wiring structure abuts an entirety of top surfaces of the array of TSVs.

According to another aspect of the present invention, a method of forming a semiconductor structure comprises:

forming at least one through substrate via (TSV) through a semiconductor substrate; and forming a layer directly on the at least one TSV, wherein a metal-wire-level dielectric layer and at least one line-level metal wiring structure complementarily fills an entirety of the layer, wherein the at least one line-level metal wiring structure includes an array of cheesing holes, and wherein an entirety of sidewalls of the at least one TSV is directly adjoined to the at least one line-level metal wiring structure and does not abut the metal-wire-level dielectric layer.

In one embodiment, each of the at least one TSV includes a seam located at a center portion of a top surface thereof, wherein the at least one line-level metal wiring structure is formed directly on a peripheral portion of a top surface of each of the at least one TSV, and wherein the array of cheesing holes overlies an entirety of the at least one seam.

In another embodiment, the method further comprises:

forming at least one semiconductor device in the semiconductor substrate;

forming a contact-via-level dielectric layer on the at least one semiconductor device; and forming at least one substrate contact via in the contact-via-level dielectric layer, wherein the at least one substrate contact via vertically abuts the at least one semiconductor device and one of the at least one line-level metal wiring structure, and wherein each of the at least one TSV extends from a top surface of the contact-via-level dielectric layer to a bottom surface of the semiconductor substrate.

In yet another embodiment, the entirety of sidewalls of the at least one TSV is disjoined from the metal-wire-level dielectric layer, and wherein all portions of the metal-wire-level dielectric layer is separated from the array of TSVs by the at least one line-level metal wiring structure.

In still another embodiment, the at least one TSV is an array of through substrate vias (TSVs), wherein each cheesing hole in the array of cheesing holes embeds an isolated portion of the metal-wire-level dielectric layer, and wherein the at least one line-level metal wiring structure is formed directly on an entirety of top surfaces of the array of TSVs.

According to yet another aspect of the present invention, a design structure embodied in a machine readable medium for designing, manufacturing, or testing a design is provided. The design structure comprises:

a first data representing a semiconductor substrate;

a second data representing at least one through substrate via (TSV) which extends through the semiconductor substrate;

a third data representing a metal-wire-level dielectric layer;

a fourth data representing at least one line-level metal wiring structure, wherein the metal-wire-level dielectric layer and the at least one line-level metal wiring structure complementarily fills an entirety of a layer located above the at least one TSV; and a fifth data representing an array of cheesing holes included in the at least one line-level metal wiring structure, wherein an entirety of sidewalls of the at least one TSV abuts the at least one line-level metal wiring structure.

In one embodiment, the second data includes a sixth data representing a seam in each of the at least one TSV and a seventh data representing a peripheral portion of a top surface of each of the at least one TSV, wherein an area represented by the fourth data overlaps an area represented by the seventh data and is disjoined from an area representing the sixth data.

In another embodiment, the second data represents an array of through substrate vias (TSVs), wherein an area of the fourth data includes an entirety of an area of the second data.

In even another embodiment, the entirety of sidewalls of the at least one TSV is disjoined from the metal-wire-level dielectric layer, and wherein all portions of the metal-wire-level dielectric layer is separated from the at least one TSV by the at least one line-level metal wiring structure.

In yet another embodiment, the design structure may further comprise another data representing a contact-via-level dielectric layer, wherein a bottom surface of the contact-via-level dielectric layer vertically abuts a top surface of the semiconductor substrate, and wherein each of the at least one TSV extends from a top surface of the contact-via-level dielectric layer to a bottom surface of the semiconductor substrate.

In still another embodiment, the design structure may further comprise:

a first additional data representing at least one semiconductor device located in the semiconductor substrate; and a second additional data representing at least one substrate contact via embedded in the contact-via-level dielectric layer and vertically abutting the at least one semiconductor device and one of the at least one line-level metal wiring structure.

BRIEF DESCRIPTION OF THE DRAWINGS

FIG. 13 is a flow diagram of a design process used in semiconductor design and manufacture of the semiconductor structures according to the present invention.

DETAILED DESCRIPTION OF THE INVENTION

Figure 1:
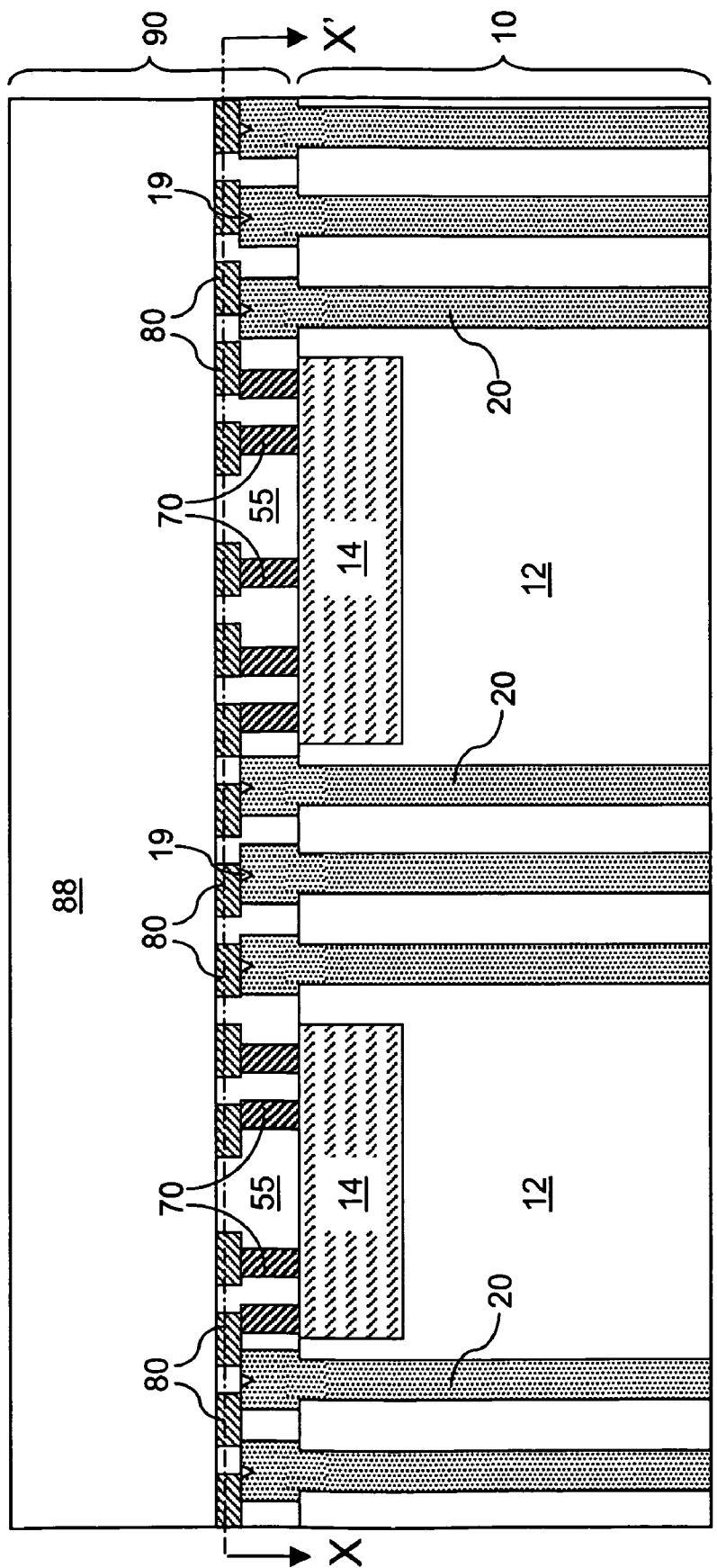
FIG. 1 is a vertical cross-sectional view of a prior art semiconductor chip.
Figure 2:
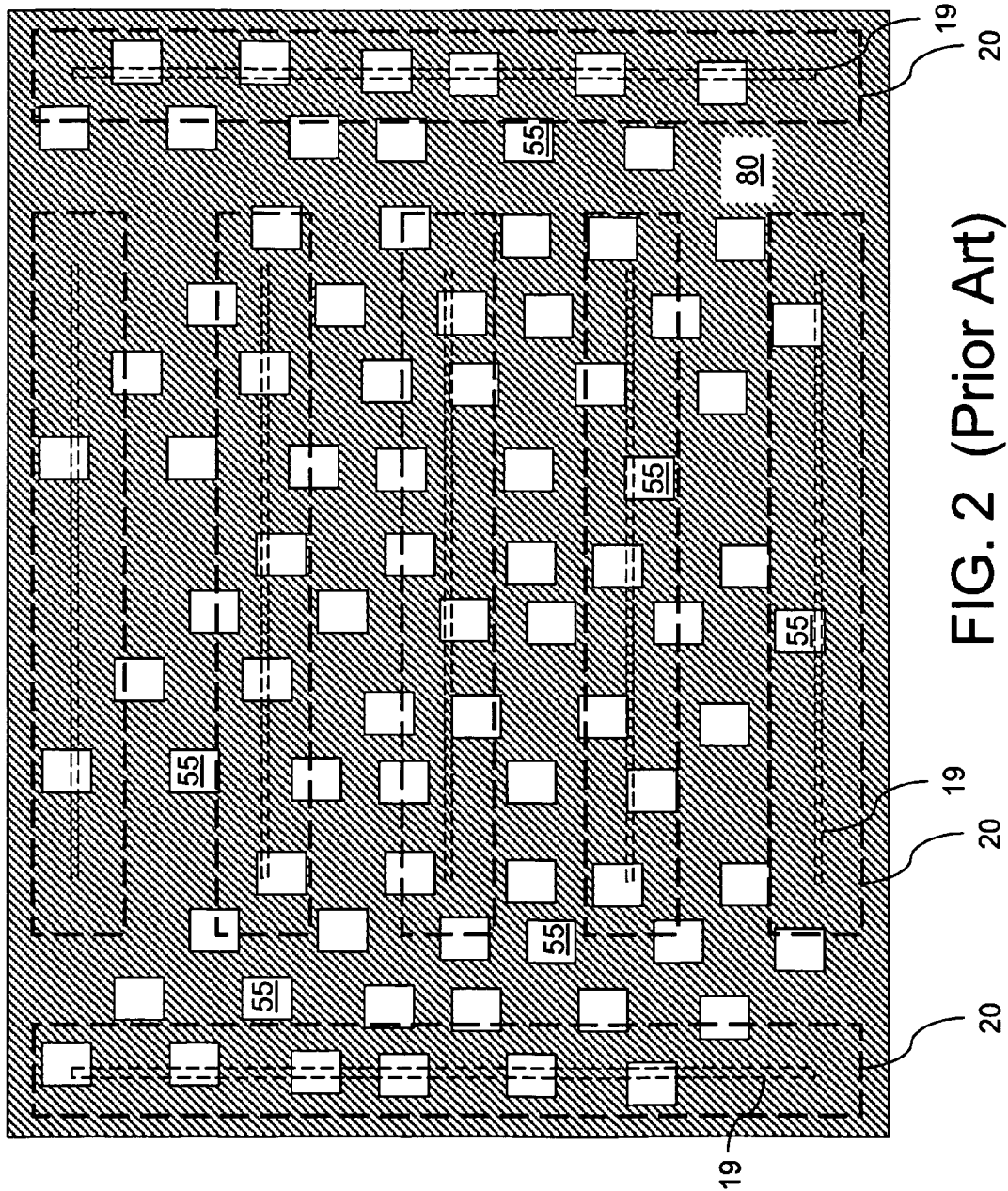
FIG. 2 is a horizontal cross-sectional view of the prior art semiconductor chip along the plane X-X' of FIG. 1.

As stated above, the present invention relates to semiconductor structures including a line-level metal wiring structure and through substrate vias, methods of manufacturing the same, and design structures for the same. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 3:
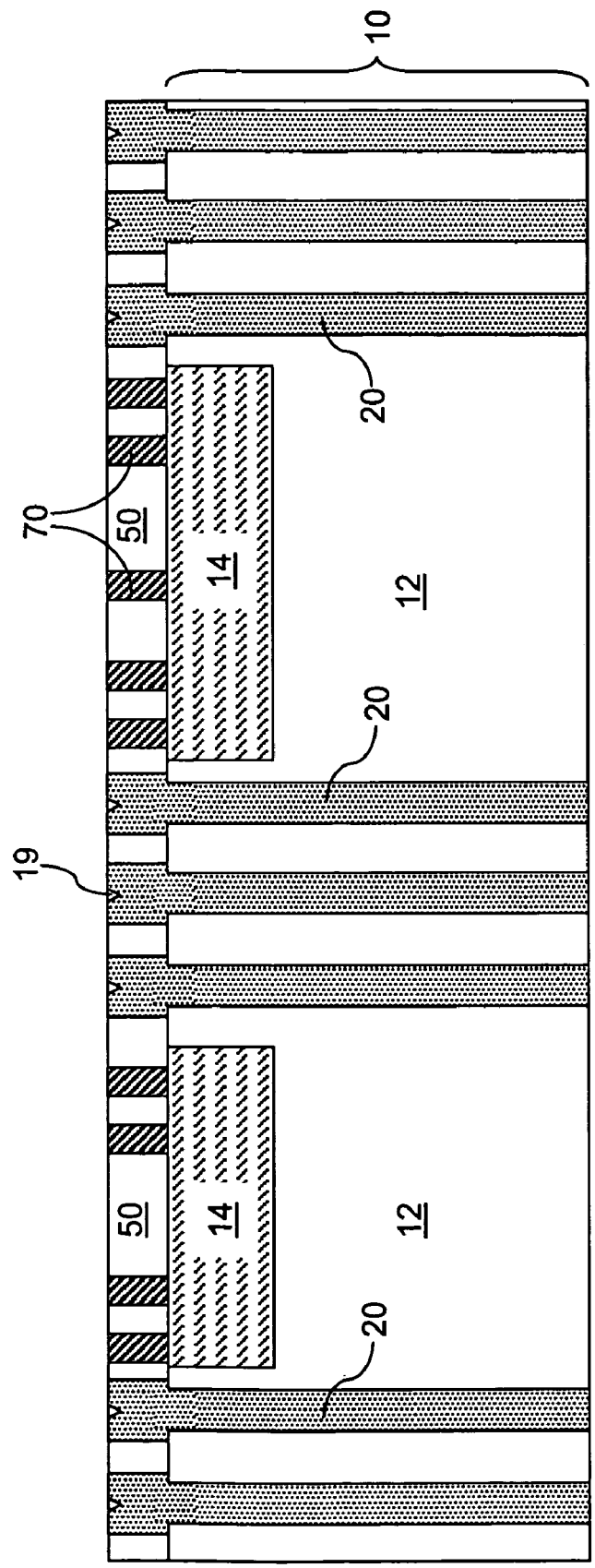
FIG. 3 is a vertical cross-sectional view of an exemplary semiconductor structure according to the present invention at a step after formation of a contact-via-level dielectric layer 50 and an array of through substrate vias 20.

Referring to FIG. 3, an exemplary semiconductor structure according to the present invention comprises a semiconductor substrate 10, a contact-via-level dielectric layer 50, through substrate vias (TSVs) 20, and substrate level contact vias 70. The semiconductor substrate 10 includes a semiconductor layer 12 comprising a semiconductor material. The semiconductor substrate 10 may be a bulk substrate or a semiconductor-on-insulator (SOI) substrate including a buried insulator layer (not shown). Semiconductor device regions 14 including various semiconductor devices are formed in upper portions of the semiconductor substrate 10 by methods known in the art. The semiconductor devices may include, for example, field effect transistors, bipolar transistors, capacitors, resistors, inductors, diodes, varactors, etc.

The various semiconductor devices in the semiconductor device regions 14 are electrically connected within the semiconductor chip employing substrate level contact vias 70 and line-level metal wiring structures 80 that are formed within a contact-via-level dielectric layer 50 formed directly on the semiconductor substrate 10.

Through substrate trenches are formed through the contact-via-level dielectric layer 50 to the bottom surface of the semiconductor substrate 10. The through substrate trenches extend from the top surface of the contact-via-level dielectric layer 50 to the bottom surface of the semiconductor substrate 10. The through substrate trenches are filled with a conductive material such as a metal or a doped semiconductor material to form through substrate vias (TSVs) 20 by deposition or plating. For example, the TSVs 20 may be formed by chemical vapor deposition (CVD), physical vapor deposition (PVD), electroplating, electroless plating, or a combination thereof. Exemplary materials for the TSVs 20 include W, Cu, doped polysilicon, etc. Each of the TSVs 20 extends from the top surface of the contact-via-level dielectric layer 50 to the bottom surface of the semiconductor substrate 10.

Irrespective of the methods employed to form the TSVs 20, the formation of the TSVs 20 starts with accumulation of the conductive material on the sidewall surfaces of the through substrate trenches since the conductive material can accumulate only on a solid surface, and not in the middle of the cavities in the through substrate trenches. As the conductive material accumulates in the through substrate trenches, the volume of the cavity in each of the through substrate trenches decreases. At the end of the formation of the TSVs 20, a seam 19, which is substantially vertical and runs through the entire height of the TSVs 20, is formed in the TSVs 20. The seams 19 are present in the TSVs 20 even after planarization that renders the top surfaces of the TSVs 20 substantially coplanar with the top surface of the contact-via-level dielectric layer 50. Depending on the degree of non-conformity, i.e., non-uniform variation of thickness of deposited conductive material with depth from the top surface of the TSVs 20, of the deposition process employed to form the TSVs 20, the seams 19 may have a substantial size. The seams 10 may reduce current carrying capability of the TSVs 20 through reduced cross-sectional area for current conduction and/or trap plating solution during a plating process.

Typically, via holes are formed in the contact-via-level dielectric layer 50 and filled with a conductive material to form substrate level contact vias 70, which provide electrical connection between the various semiconductor devices in the semiconductor device regions 14 and interconnect structures to be subsequently formed.

Figure 4:
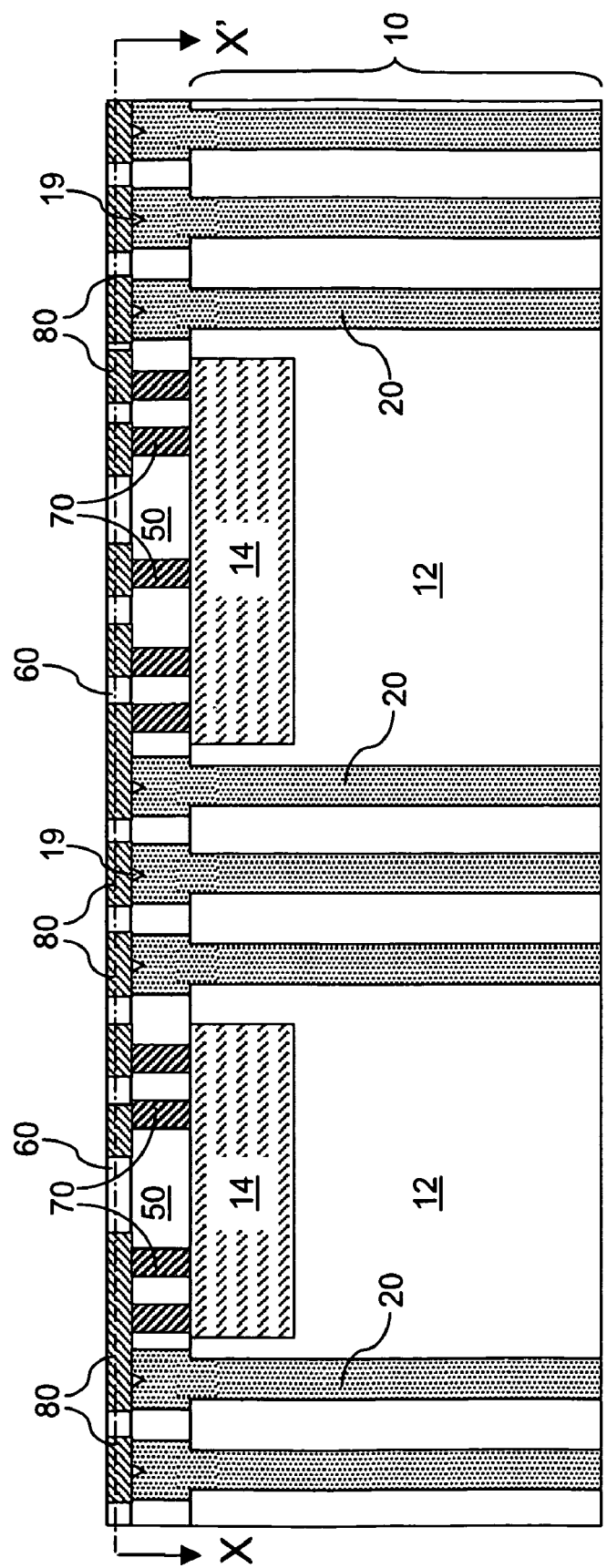
FIG. 4 is a vertical cross-sectional view of the exemplary semiconductor structure according to the present invention at a step after formation of a metal-wire-level dielectric layer 60 and at least one line-level metal wiring structure including at least one cheesing hole.

Referring to FIG. 4, a metal-wire-level dielectric layer 60 is thereafter deposited on the contact-via-level dielectric layer 50. A photoresist (not shown) is applied over the metal-wire-level dielectric layer 60 and lithographically patterned to include openings in the shape of at least one line-level metal wiring structure to be subsequently formed within the metal-wire-level dielectric layer 60. The pattern in the photoresist is transferred into the metal-wire-level dielectric layer 60 by an anisotropic etch that employs the photoresist as an etch mask. Typically, the etch proceeds at least down to the interface between the contact-via-level dielectric layer 50 and the metal-wire-level dielectric layer 60 to form at least one recessed region.

The pattern of the recessed area includes an array of holes, which is herein referred to as cheesing holes. The area of the array of the cheesing holes is covered by the photoresist during the etch that forms the at least one recessed region. Thus, each cheesing hole includes an isolated portion of the metal-wire-level dielectric layer 60. The at least one recessed region is filled with a conductive material up to a level above the top surface of the remaining portions of the metal-wire-level dielectric layer 60. The conductive material typically comprises a metal such as Cu or Al. The conductive material is planarized, for example, by chemical mechanical planarization (CMP) down to the top surfaces of the metal-wire-level dielectric layer 60 to form at least one line-level metal wiring structure 80.

The present invention provides configurations for an array of cheesing holes contained in the at least one line-level metal wiring structure 80 for the purpose of increasing current carrying capability of the TSVs 20 and/or for the purpose of enhancing reliability of the TSVs 20 during the lifetime of a semiconductor chip incorporating the exemplary semiconductor structure. The exemplary semiconductor structure may have various patterns for the array of cheesing holes contained in the at least one line-level metal wiring structure 80, which are described below in various embodiment of the present invention.

Figure 5:
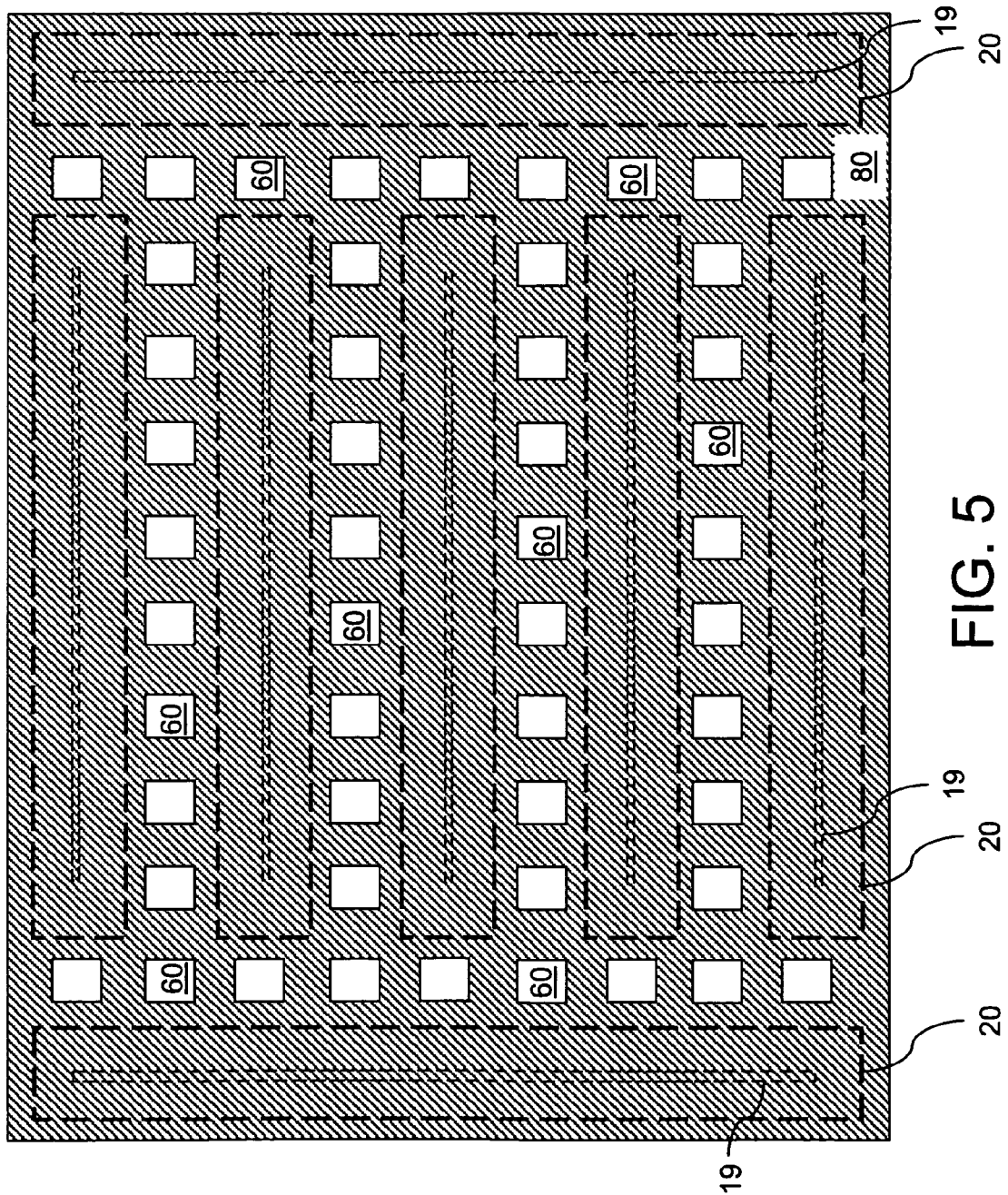
FIGS. 5, 6, 7, 8, and 9 are a horizontal cross-sectional views of the exemplary semiconductor structure according to first, second, third, fourth, and fifth embodiments, respectively, of the present invention along the plane X-X' of FIG. 4. Locations of sidewalls of the through substrate vias 20 abutting the at least one line-level metal wiring structure 80 and the area of seams 19 in the through substrate vias 20 are schematically represented by thick dotted lines and thin dotted lines, respectively.

Referring to FIG. 5, a horizontal cross-sectional view of the exemplary semiconductor structure according to a first embodiment of the present invention is shown along the plane X-X' of FIG. 4. Locations of sidewalls of the TSVs 20 that abut the at least one line-level metal wiring structure 80 are shown in thick dotted lines as if a top-down see-through view was employed to illustrate the location of an array of cheesing holes relative to the sidewalls of the TSVs 20. The area of the seams 19 in the TSVs 20 are schematically represented by thin dotted lines as if a top-down see-through view was employed to illustrate the location of the array of cheesing holes relative to the seams 19.

The at least one line-level metal wiring structure 80 and the metal-wire-level dielectric layer 60 complimentarily fill the entirety of the a layer between top surfaces of the TSVs 20 and the top surfaces of the metal-wire-level dielectric layer 60. The entirety of the sidewalls of the at least one TSV 20 abuts the at least one line-level metal wiring structure 80. In other words, the entirety of the lateral peripheries of the at least one TSV 20 is adjoined to a set of bottom surfaces of the at least one line-level metal wiring structure 80. Thus, the entirety of the sidewalls of the at least one TSV 20 is disjoined from the metal-wire-level dielectric layer 60. Typically, the at least one TSV 20 is an array of TSVs 20.

The at least one line-level metal wiring structure 80 includes an array of cheesing holes, which is filled with isolated portions of the metal-wire-level dielectric layer 60. Specifically, each cheesing hole in the array of cheesing holes embeds an isolated portion of the metal-wire-level dielectric layer 60. In a horizontal planar see-through view in which the area of the at least one TSV 20 (which is the sum of the areas of the rectangles represented by thick dotted lines) is explicitly manifested, the area of the at least one TSV 20 is disjoined from the area of the metal-wire-level dielectric layer 60 including any isolated or contiguous portions. The horizontal planar see-through view may be obtained, for example, by converting the thick dotted lines for the at least one TSV into solid lines.

Since all of the cheesing holes in the at least one line-level metal wiring structure 80 are disjoined from the top surfaces of the at least one TSV 20 and none of the cheesing holes in the at least one line-level metal wiring structure 80 overlies any of the at least one TSV 20, the at least one line-level metal wiring structure 80 abuts an entirety of the top surfaces of the at least one TSV 20. In other words, no portion of the metal-wire-level dielectric layer 60, whether the portion is located outside and embeds the metal-wire-level dielectric layer 60 or whether the portion is an isolated portion embedded in the metal-wire-level dielectric layer 60, abuts the at least one TSV 20.

The array of cheesing holes may include at least one linear array of cheesing holes located between an area of a TSV 20 and an area of a neighboring TSV 20. A plurality of linear array of cheesing holes may be present in the at least one line-level metal wiring structure 80. The at least one linear array of cheesing holes may include a regular linear array of cheesing holes containing a repletion of a unit pattern in one direction. The unit pattern may include a region of a cheesing hole and a complementary region that does not contain the cheesing hole. The cheesing hole in the unit pattern may have a shape of a polygon, a closed curvilinear shape, or a combination thereof. For example, the shape of the cheesing hole in the unit pattern may have a substantially square shape, i.e., may have a horizontal cross-sectional area of a shape that is substantially a square subject to deformation of shape during lithographic printing of the shape.

Since the area of the at least one line-level metal wiring structure 80 overlies the entirety of the at least one TSV 20, the area of the at least one line-level metal wiring structure 80 overlies the entirety of the areas of the seams 19 in the at least one TSV 20, which is confined within the area of the of the at least one TSV 20.

Figure 6:
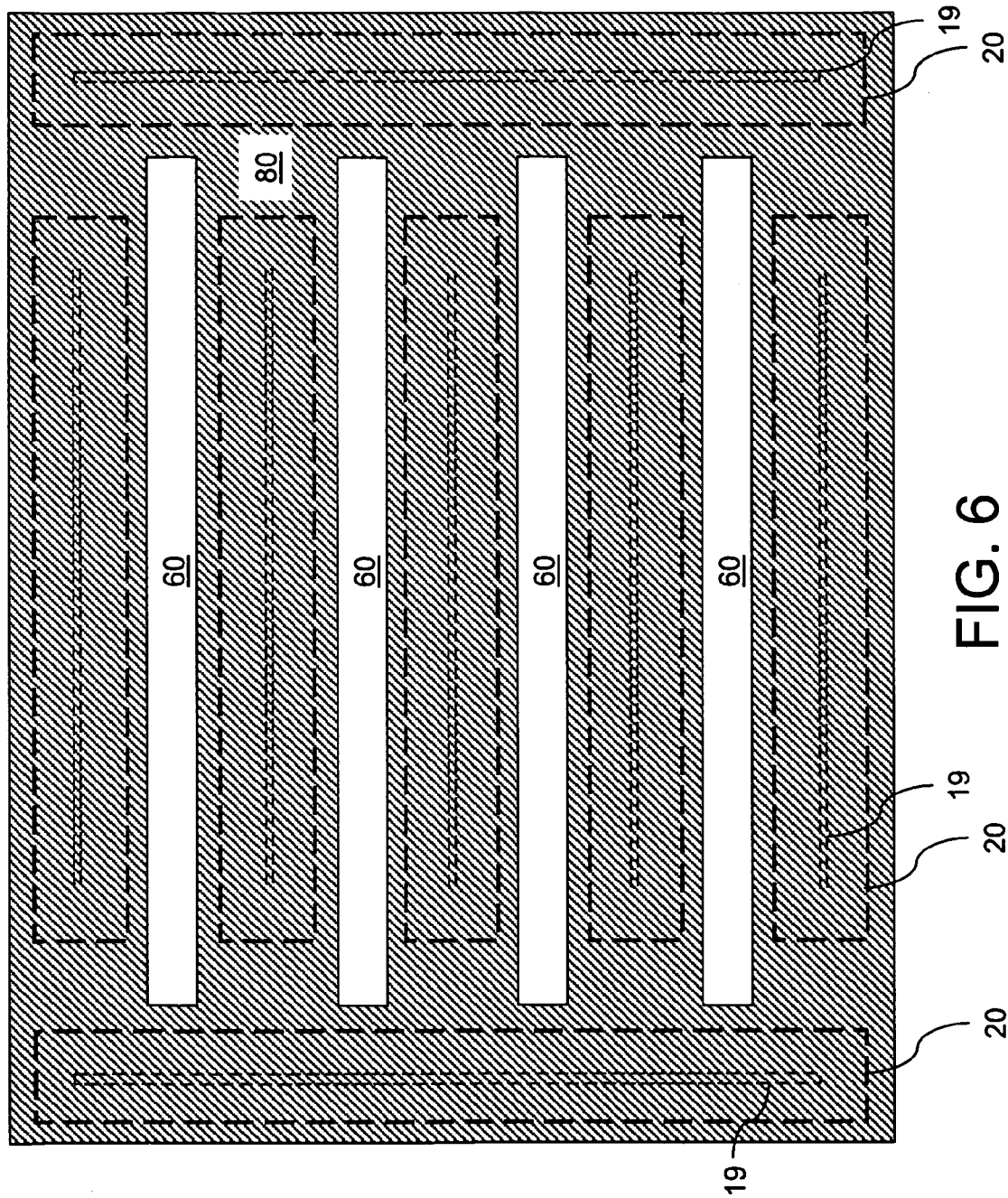

Referring to FIG. 6, a horizontal cross-sectional view of the exemplary semiconductor structure according to a second embodiment of the present invention is shown along the plane X-X' of FIG. 4. Locations of sidewalls of the TSVs 20 that abut the at least one line-level metal wiring structure 80 are shown in thick dotted lines as if a top-down see-through view was employed to illustrate the location of an array of cheesing holes relative to the sidewalls of the TSVs 20. The area of the seams 19 in the TSVs 20 are schematically represented by thin dotted lines as if a top-down see-through view was employed to illustrate the location of the array of cheesing holes relative to the seams 19.

The at least one line-level metal wiring structure 80 and the metal-wire-level dielectric layer 60 complimentarily fill the entirety of the a layer between top surfaces of the TSVs 20 and the top surfaces of the metal-wire-level dielectric layer 60 in the same manner as in the first embodiment. The entirety of the sidewalls of the at least one TSV 20 abuts the at least one line-level metal wiring structure 80 as in the first embodiment. Also, the entirety of the sidewalls of the at least one TSV 20 is disjoined from the metal-wire-level dielectric layer 60. Typically, the at least one TSV 20 is an array of TSVs 20.

The at least one line-level metal wiring structure 80 includes an array of cheesing holes, which is filled with isolated portions of the metal-wire-level dielectric layer 60. Specifically, each cheesing hole in the array of cheesing holes embeds an isolated portion of the metal-wire-level dielectric layer 60. In a horizontal planar see-through view in which the area of the at least one TSV 20 (which is the sum of the areas of the rectangles represented by thick dotted lines) is explicitly manifested, the area of the at least one TSV 20 is disjoined from the area of the metal-wire-level dielectric layer 60 including any isolated or contiguous portions. The at least one line-level metal wiring structure abuts an entirety of the top surfaces of the at least one TSV 20.

The array of cheesing holes may include a substantially rectangular cheesing hole located between an area of a TSV 20 and an area of a neighboring TSV 20. In one case, the lateral length of the substantially lateral cheesing hole is less than a lengthwise direction of the TSV 20 or the neighboring TSV 20. In another case, the lateral length of the substantially lateral cheesing hole is greater than, or the same as, a lengthwise direction of the TSV 20 or the neighboring TSV 20.

The array of cheesing holes may include an array of substantially rectangular cheesing holes, i.e., a plurality of substantially rectangular cheesing holes arranged as a one-dimensional array or a two-dimensional array. The size and spacing of the substantially rectangular cheesing holes may be regular and periodic, or may be irregular.

Figure 7:
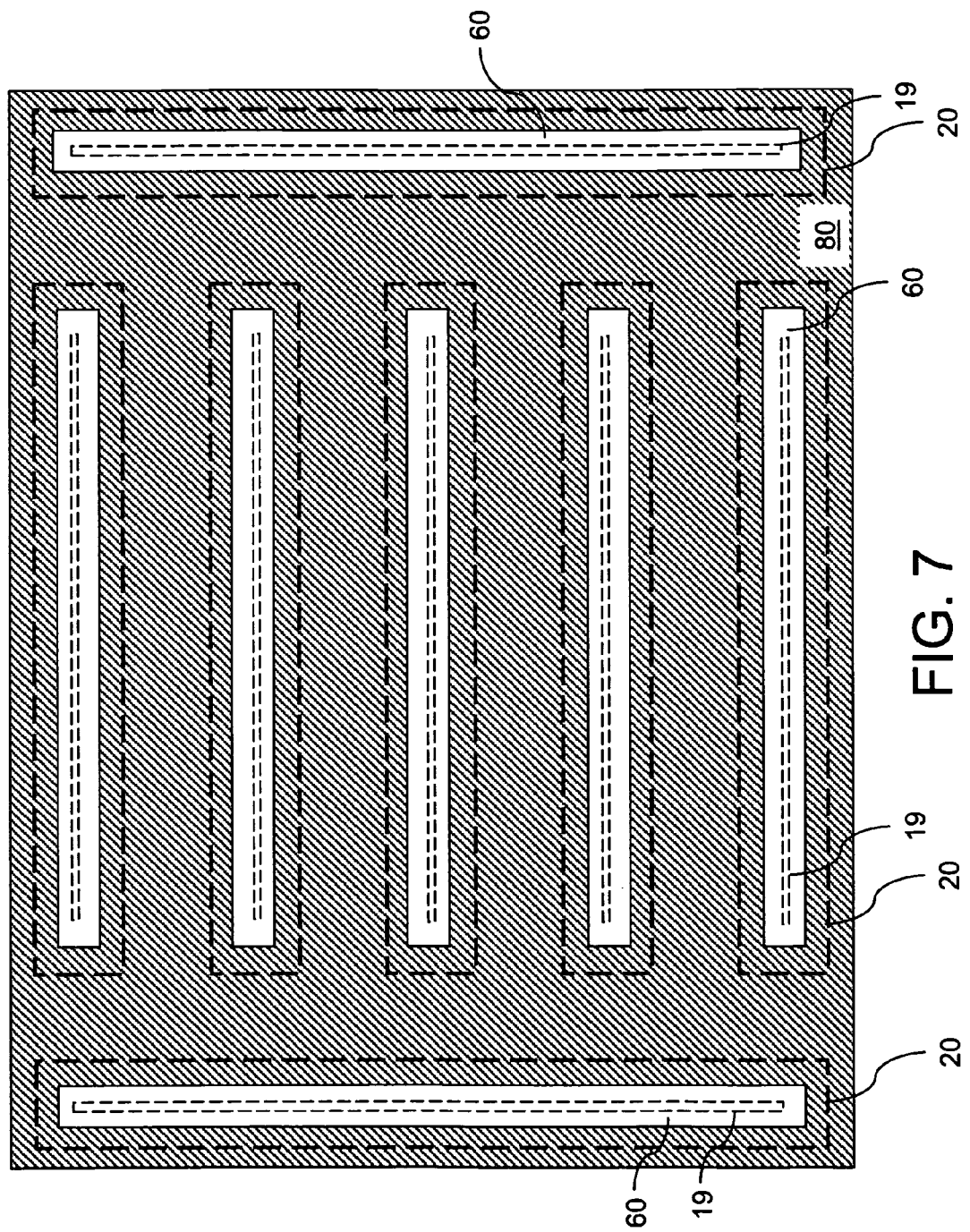

Referring to FIG. 7, a horizontal cross-sectional view of the exemplary semiconductor structure according to a third embodiment of the present invention is shown along the plane X-X' of FIG. 4. Locations of sidewalls of the TSVs 20 that abut the at least one line-level metal wiring structure 80 are shown in thick dotted lines as if a top-down see-through view was employed to illustrate the location of an array of cheesing holes relative to the sidewalls of the TSVs 20. The area of the seams 19 in the TSVs 20 are schematically represented by thin dotted lines as if a top-down see-through view was employed to illustrate the location of the array of cheesing holes relative to the seams 19.

The at least one line-level metal wiring structure 80 and the metal-wire-level dielectric layer 60 complimentarily fill the entirety of the a layer between top surfaces of the TSVs 20 and the top surfaces of the metal-wire-level dielectric layer 60. The entirety of the sidewalls of the at least one TSV 20 abuts the at least one line-level metal wiring structure 80. Thus, the entirety of the sidewalls of the at least one TSV 20 is disjoined from the metal-wire-level dielectric layer 60. Typically, the at least one TSV 20 is an array of TSVs 20.

The array of cheesing holes is formed entirely within the area of the at least one TSVs 20. Each of the at least one TSV 20 includes a seam 19 located at a center portion of the top surface of each of the at least one TSV 20. Each cheesing hole in the array of cheesing holes is located over a center portion of a TSV 20, and overlies an entirety of a seam 19 within that TSV. Thus, the array of cheesing holes overlies the entirety of the areas of the seams 19 within the at least one TSVs 20. The at least one line-level metal wiring structure 80 abuts a peripheral portion of the top surface of the at least one TSVs 20. Each center portion of the top surface of a TSV 20 includes all of the area of the seam 19 of the TSV 20, and each peripheral portion of the top surface of the TSV 20 excludes all of the area of the seam 19 of the TSV 20. The center portion and the peripheral portion of each TSV 20 are exclusive of each other.

Each cheesing hole in the array of cheesing holes embeds an isolated portion of the metal-wire-level dielectric layer 60. In a horizontal planar see-through view in which the area of the at least one TSV 20 (which is the sum of the areas of the rectangles represented by thick dotted lines) is explicitly manifested, the area of the isolated portions of the metal-wire-level dielectric layer 60 in cheesing holes is included in the area of the at least one TSV 20. The isolated portion of the metal-wire-level dielectric layer 60 separates a seam 19 located underneath the isolated portion from the at least one line-level metal wiring structure 80. A set of isolated portions of the metal-wire-level dielectric layer 60 overlies an entirety of the seams 19 in the at least one TSV 20.

Figure 8:
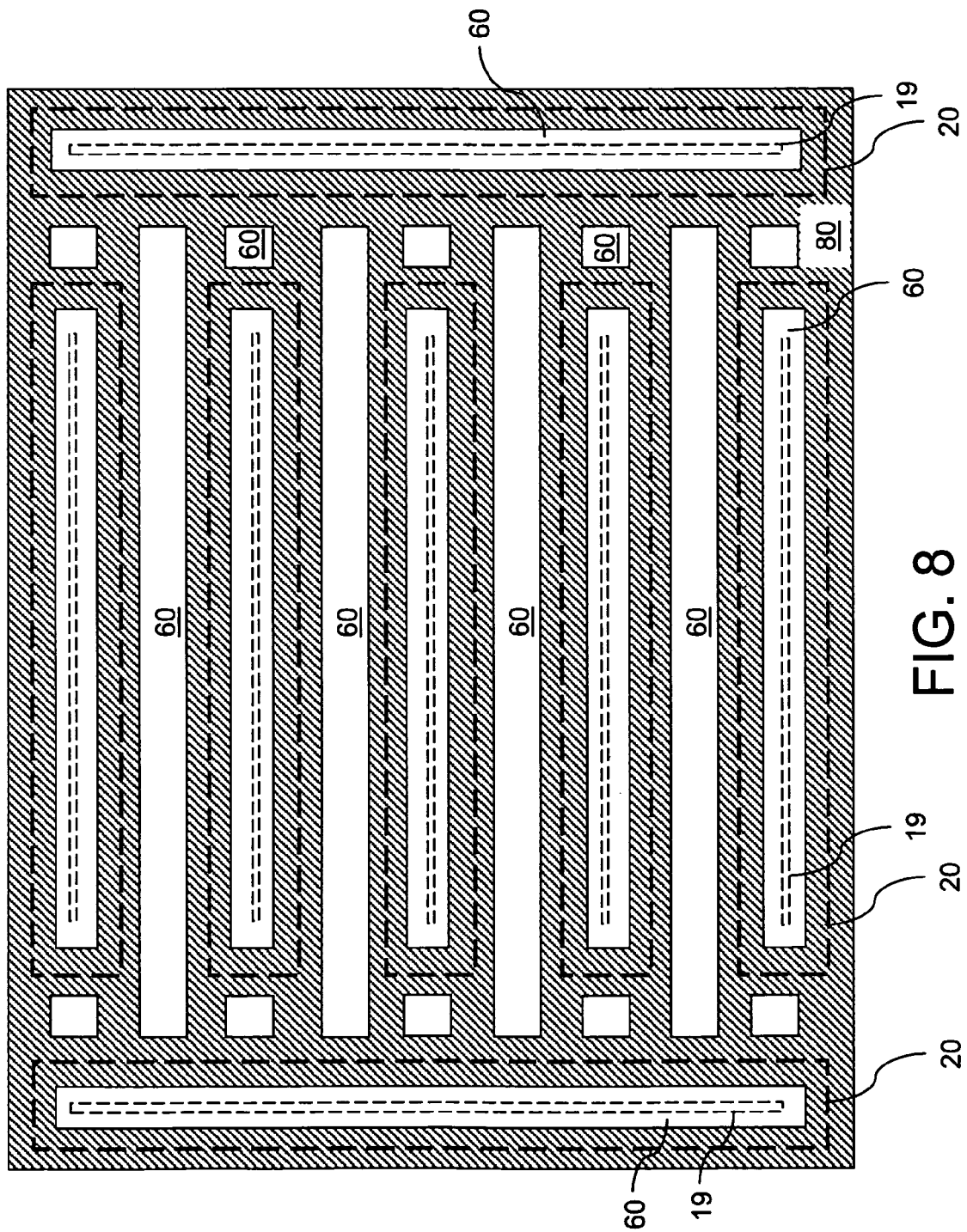

Referring to FIG. 8, a horizontal cross-sectional view of the exemplary semiconductor structure according to a fourth embodiment of the present invention is shown along the plane X-X' of FIG. 4. Locations of sidewalls of the TSVs 20 that abut the at least one line-level metal wiring structure 80 are shown in thick dotted lines as if a top-down see-through view was employed to illustrate the location of an array of cheesing holes relative to the sidewalls of the TSVs 20. The area of the seams 19 in the TSVs 20 are schematically represented by thin dotted lines as if a top-down see-through view was employed to illustrate the location of the array of cheesing holes relative to the seams 19. The structure of the fourth embodiment may be derived by combining the structure of the third embodiment with the structure of the first and/or second embodiment.

The at least one line-level metal wiring structure 80 and the metal-wire-level dielectric layer 60 complimentarily fill the entirety of the a layer between top surfaces of the TSVs 20 and the top surfaces of the metal-wire-level dielectric layer 60 as in the first through third embodiments. The entirety of the sidewalls of the at least one TSV 20 abuts the at least one line-level metal wiring structure 80. Thus, the entirety of the sidewalls of the at least one TSV 20 is disjoined from the metal-wire-level dielectric layer 60. Typically, the at least one TSV 20 is an array of TSVs 20.

The exemplary semiconductor structure according to a fourth embodiment includes a first array of cheesing holes that is substantially the same as the array of cheesing holes in the third embodiment and a second array of cheesing holes that may be substantially the same as the array of cheesing holes in the first embodiment and/or the array of cheesing holes in the second embodiment.

Specifically, the first array of cheesing holes is formed entirely within the area of the at least one TSVs 20. Each cheesing hole in the first array of cheesing holes is located over a center portion of a TSV 20, and overlies an entirety of a seam 19 within that TSV. Thus, the first array of cheesing holes overlies the entirety of the areas of the seams 19 within the at least one TSVs 20. The at least one line-level metal wiring structure 80 abuts a peripheral portion of the top surface of the at least one TSVs 20. Each cheesing hole in the first array of cheesing holes embeds an isolated portion of the metal-wire-level dielectric layer 60. The isolated portion of the metal-wire-level dielectric layer 60 located in the first array of cheesing holes separates a seam 19 located underneath the isolated portion from the at least one line-level metal wiring structure 80. A set of isolated portions of the metal-wire-level dielectric layer 60 located within the first array of cheesing holes overlies an entirety of the seams 19 in the at least one TSV 20.

The second array of cheesing holes is disjoined from the top surfaces of the at least one TSV 20. In other words, none of the cheesing holes in second array of cheesing holes overlies any of the at least one TSV 20. Each cheesing hole in the second array of cheesing holes is also filled with isolated portions of the metal-wire-level dielectric layer 60. The second array of cheesing holes may include at least one linear array of cheesing holes located between an area of a TSV 20 and an area of a neighboring TSV 20 as in the first embodiment. Alternately or additionally, the second array of cheesing holes may include a substantially rectangular cheesing hole located between an area of a TSV 20 and an area of a neighboring TSV 20 as in the second embodiment.

Unlike the first or second embodiment, some portions of the metal-wire-level dielectric layer 60 abuts the at least one TSV 20. Specifically, isolated portions of the metal-wire-level dielectric layer 60 filling the first array of cheesing holes abut the top surfaces of the at least one TSV 20.

Figure 9:
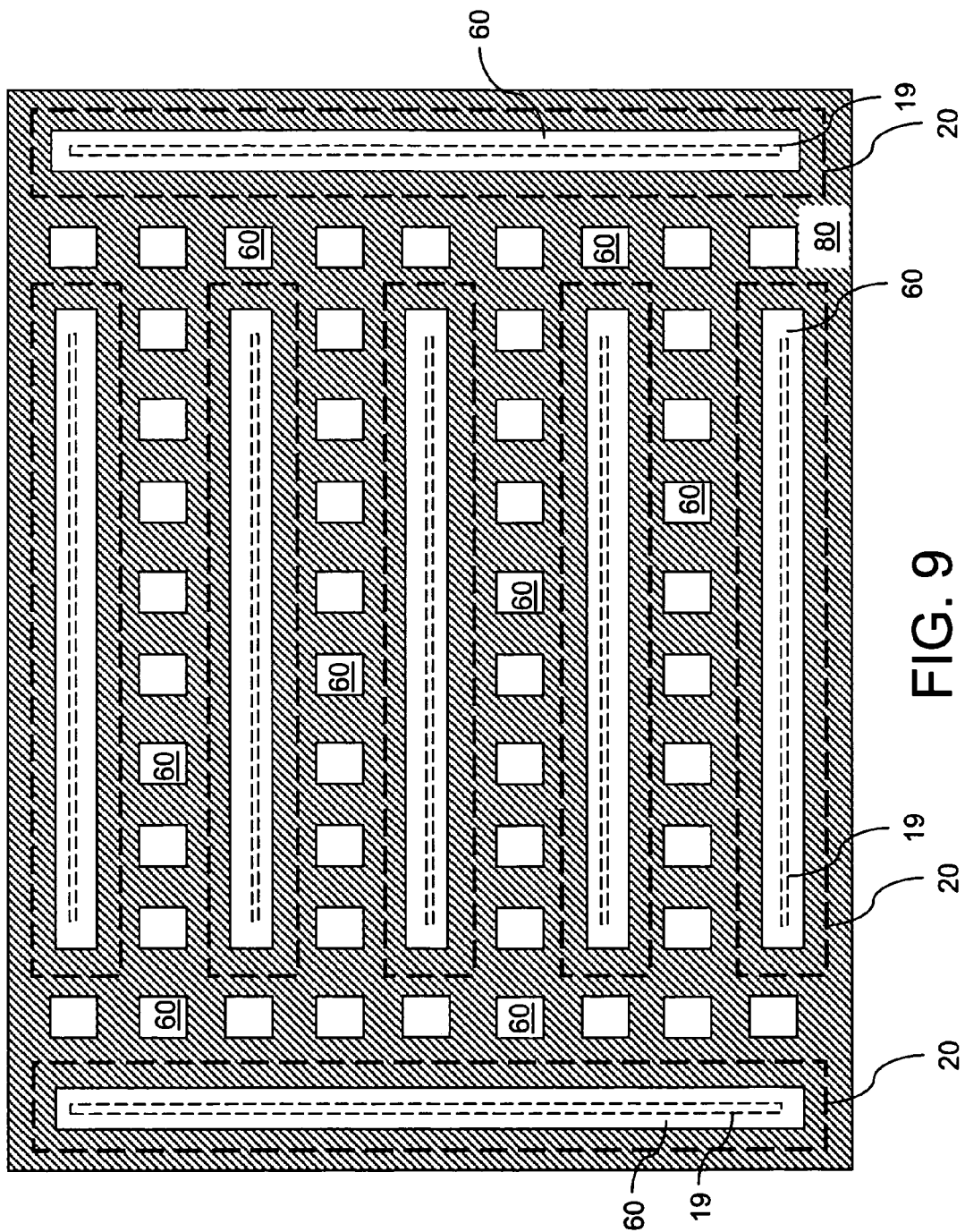

Referring to FIG. 9, a horizontal cross-sectional view of the exemplary semiconductor structure according to a fifth embodiment of the present invention is shown along the plane X-X' of FIG. 4. The structure of the fifth embodiment may be derived by combining the structure of the third embodiment with the structure of the first embodiment. The exemplary semiconductor structure according to a fifth embodiment includes a first array of cheesing holes that is substantially the same as the array of cheesing holes in the third embodiment and a second array of cheesing holes that may be substantially the same as the array of cheesing holes in the first embodiment.

Figure 10:
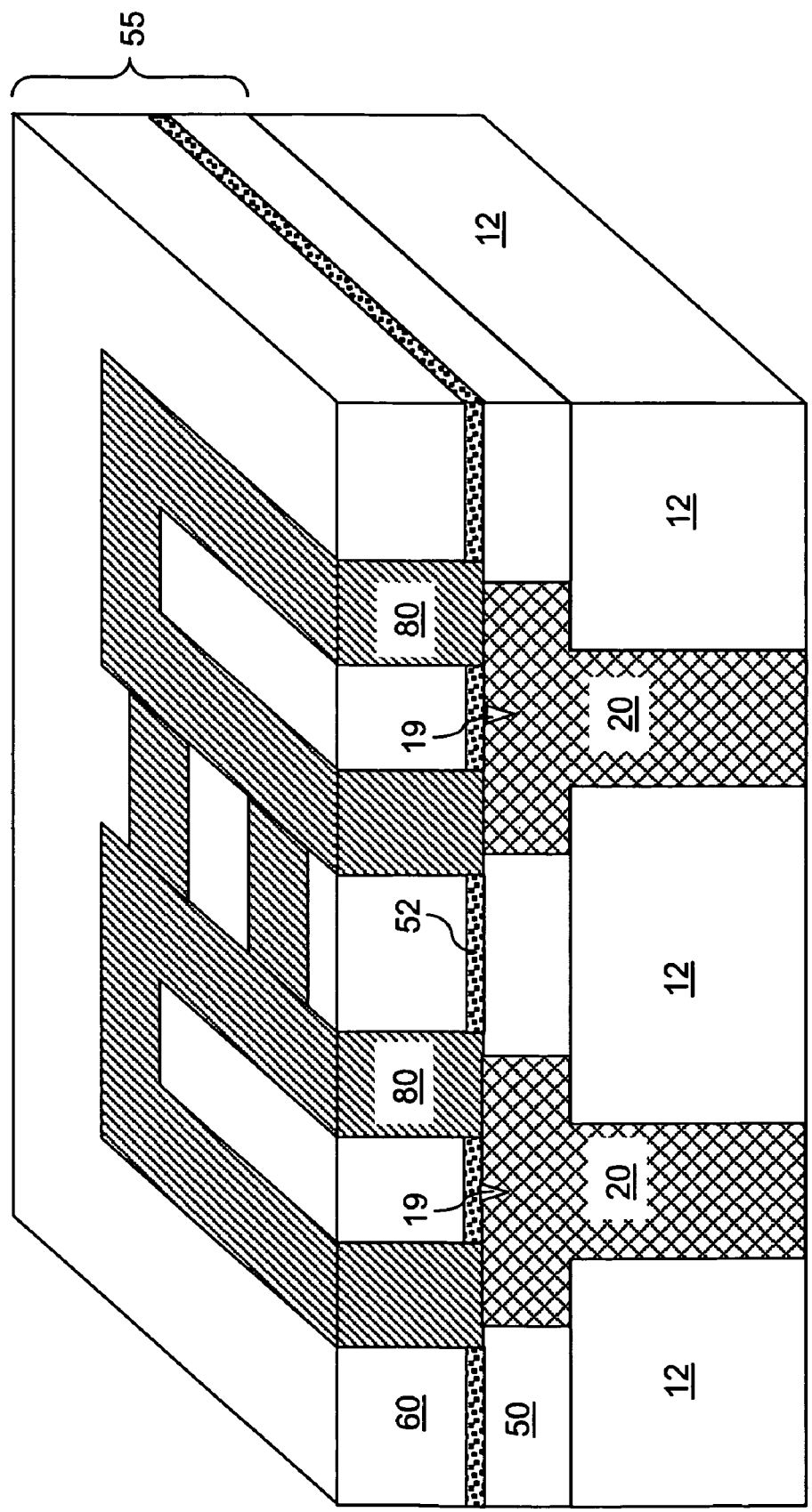
FIG. 10 is a bird's eye view of a portion of a sixth embodiment of the exemplary semiconductor structure according to the present invention.
Figure 11:
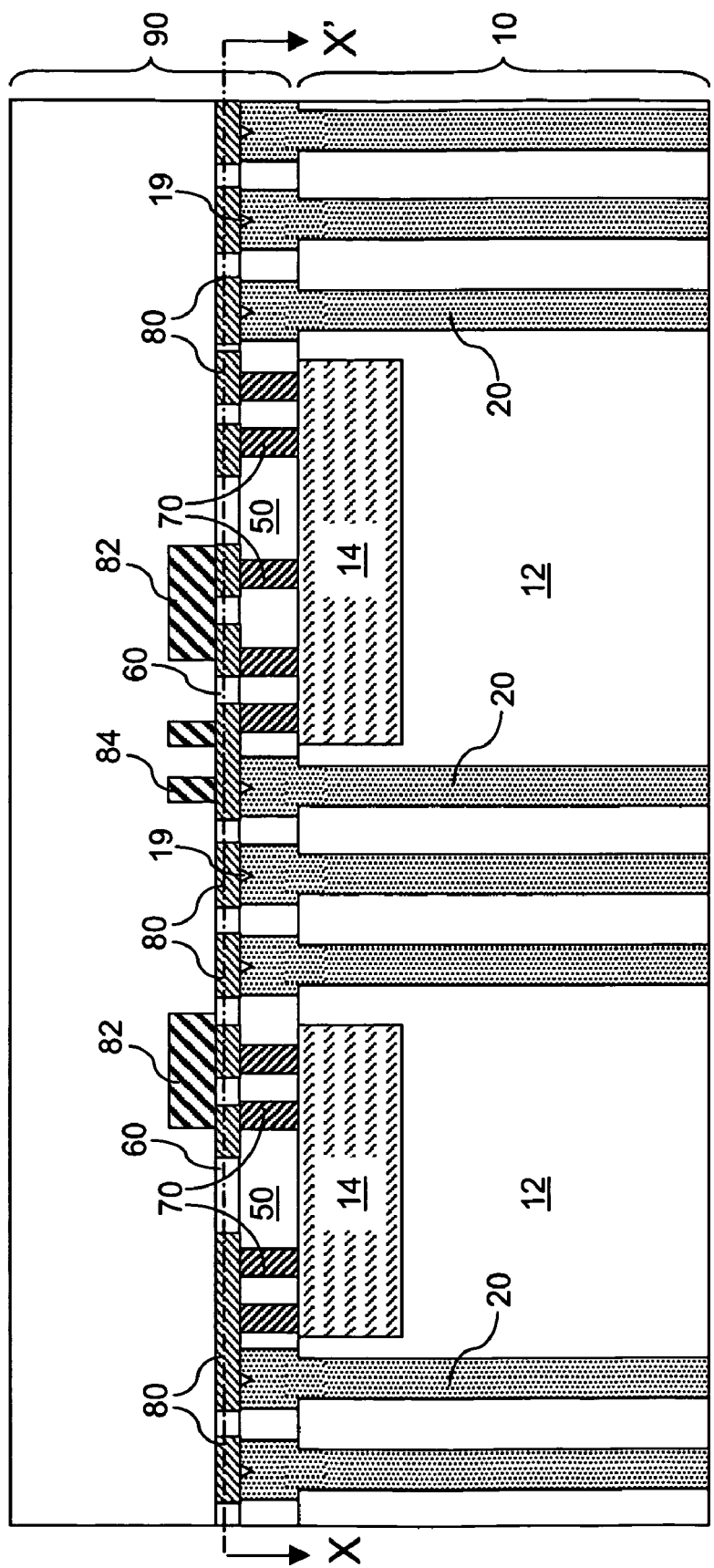
FIG. 11 is a vertical cross-sectional view of the exemplary semiconductor structure according to the present invention after formation of a metal interconnects structure 90, which includes first-via-level via bars 82 and first-via-level vias 84.

Referring to FIG. 10, a bird's eye view of a portion of a sixth embodiment of the exemplary semiconductor structure according to the present invention is shown. Various elements of the first through fifth embodiments of the present invention may be combined to form at least one line-level metal wiring structure 80 embedded in a metal-wire-level dielectric layer 60. An optional dielectric capping layer 52 may be formed above the contact-via-level dielectric layer 50 after formation of the at least one TSV 20. The metal-wire-level dielectric layer 60 is deposited on the optional dielectric capping layer 52. The optional dielectric capping layer 52 may be patterned with the metal-wire-level dielectric layer 60 employing the same photoresist. In one embodiment, the optional dielectric capping layer 52 may be formed over the seams 19 to prevent trapping of a plating solution during plating of a conductive metal that forms the at least one line-level metal wiring structure 80. The stack of the contact-via-level dielectric layer 50, the optional dielectric capping layer 52, and the metal-wire-level dielectric layer 60 collectively constitute a back-end-of-line (BEOL) dielectric layer 15 that abuts the semiconductor layer 12.

Referring to FIG. 1, additional dielectric layers and additional conductive metal interconnect structures are subsequently formed on top of the exemplary semiconductor structure of FIG. 4. The additional conductive metal interconnect structures may include first-via-level via bars 82 and first-via-level vias 84. Other conductive wiring structures (not shown) may be formed in the metal interconnect structure 90. Bond pads (not shown) or solder ball pads (not shown) may be formed on a top surface of the metal interconnect structure 90. Electrical connection between the semiconductor devices in the semiconductor device regions 14 and the bond pads or the solder ball pads is provided by conductive wiring structures in the metal interconnect structure 90, which include, among others, the substrate level contact vias 70, the at least one line-level metal wiring structure 80, the first-via-level via bars 82, and the first-via-level vias 84.

Figure 12:
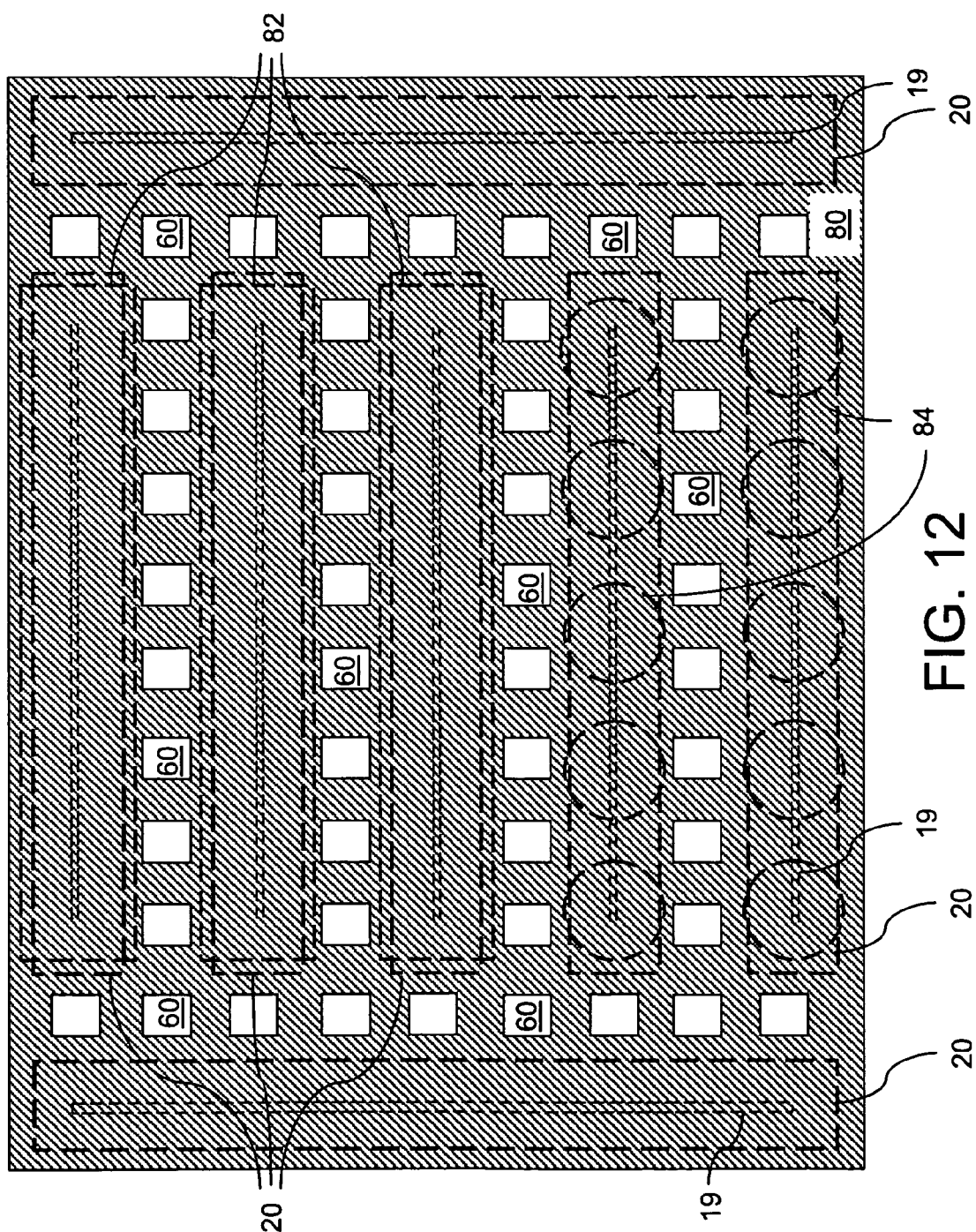
FIG. 12 is a horizontal cross-sectional view of a seventh embodiment of the exemplary semiconductor structure according to the present invention. Locations of sidewalls of the through substrate vias 20 abutting the at least one line-level metal wiring structure 80 and the area of seams 19 in the through substrate vias 20 are schematically represented by thick dotted lines and thin dotted lines, respectively. Further, locations of first-via-level via bars 82 and first-via-level vias 84 are also schematically represented by thick dotted lines.

Referring to FIG. 12, a horizontal cross-sectional view of the exemplary semiconductor structure according to a seventh embodiment of the present invention is shown along the plane X-X' of FIG. 4. Locations of sidewalls of the TSVs 20 that abut the at least one line-level metal wiring structure 80 are shown in thick dotted lines as if a top-down see-through view was employed to illustrate the location of an array of cheesing holes relative to the sidewalls of the TSVs 20. The area of the seams 19 in the TSVs 20 are schematically represented by thin dotted lines as if a top-down see-through view was employed to illustrate the location of the array of cheesing holes relative to the seams 19. The portion of the exemplary semiconductor structure according to the seventh embodiment from the bottom surface of a semiconductor substrate 10 up to the top surface of a layer complimentarily filled with a metal-wire-level dielectric layer 60 and the at least one line-level metal wiring structures 80 may be the same as one of the exemplary semiconductor structures according to the first through sixth embodiments.

First-via-level via bars 82 and first-via-level vias 84 are formed directly on the top surface of the at least one line-level metal wiring structures 80. The cross-sectional areas of the first-via-level via bars 82 and the first-via-level vias 84 overlap the area of the at least one line-level metal wiring structures 80. Preferably, the entirety of the first-via-level via bars 82 and the first-via-level vias 84 overlies the at least one line-level metal wiring structures 80 and does not overlie any portion of the metal-wire-level dielectric layer 60. Thus, all cheesing holes in the at least one line-level metal wiring structures 80 are disjoined from the first-via-level via bars 82 and the first-via-level vias 84.

In this case, the first-via-level via bars 82 and the first-via-level vias 84 overlies some of the at least one TSV 20, thereby facilitating current conduction between the at least one TSV and the first-via-level via bars 82 and the first-via-level vias 84. Such an arrangement is enabled due to the placement of the cheesing holes in a pattern of an array, and preferably, in a pattern of a periodic array of the cheesing holes that is located around the at least one TSV 20, while not contacting the at least one TSV 20.

FIG. 13 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 3-12. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 13 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 3-12. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 3-12 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 3-12. In one embodiment, design structure 990 may comprise a compiled, executable HDL simulation model that functionally simulates the devices shown in FIGS. 3-12.

In one embodiment, design structure 920 may comprise:
a first data representing a semiconductor substrate 10 (See FIGS. 3, 4, and 11);
a second data representing at least one through substrate via (TSV) 20 (See FIGS. 3-11) which extends through the semiconductor substrate 10; and
a third data representing a metal-wire-level dielectric layer 60 (See FIGS. 4-11);
a fourth data representing at least one line-level metal wiring structure 80 (See FIGS. 4-11), wherein the metal-wire-level dielectric layer 60 and the at least one line-level metal wiring structure 80 complementarily fills an entirety of a layer (60, 80) located above the at least one TSV 20; and a fifth data representing an array of cheesing holes included in the at least one line-level metal wiring structure 80, wherein an entirety of sidewalls of the at least one TSV 20 abuts the at least one line-level metal wiring structure 80.

In one embodiment, the second data includes a sixth data representing a seam 90 in each of the at least one TSV 20 and a seventh data representing a peripheral portion of a top surface of each of the at least one TSV 20, wherein an area represented by the fourth data overlaps an area represented by the seventh data and is disjoined from an area representing the sixth data. For example, the area represented by the fourth data is the area of the at least one line-level metal wiring structure 80 in FIGS. 7-9, the area represented by the seventh data is the overlap area between the area of the at least one line-level metal wiring structure 80 in FIGS. 7-9, and the area of the at least one TSV 20, and the area represented by the sixth data is the area of the seams 90 in FIGS. 7-9.

In another embodiment, the second data represents an array of through substrate vias (TSVs), wherein an area of the fourth data includes an entirety of an area of the second data. For example, the area represented by the second data is the area of the at least one TSV 20 in FIGS. 5 and 6, and the area represented by the fourth data is the area of the at least one line-level metal wiring structure 80 in FIGS. 5 and 6.

In even another embodiment, the entirety of sidewalls of the at least one TSV 20 (See FIGS. 3-11) is disjoined from the metal-wire-level dielectric layer 60. Further, all portions of the metal-wire-level dielectric layer 60 may be separated from the at least one TSV 20 by the at least one line-level metal wiring structure 80 as shown in FIGS. 5 and 6.

In yet another embodiment, the design structure may further comprise another data representing a contact-via-level dielectric layer 50 (See FIGS. 3, 4, and 11), wherein a bottom surface of the contact-via-level dielectric layer 50 vertically abuts a top surface of the semiconductor substrate 10, and wherein each of the at least one TSV 20 extends from a top surface of the contact-via-level dielectric layer 50 to a bottom surface of the semiconductor substrate 10.

In still another embodiment, the design structure may further comprise:
a first additional data representing at least one semiconductor device located in the semiconductor substrate 10; and
a second additional data representing at least one substrate contact via 70 embedded in the contact-via-level dielectric layer 60 and vertically abutting the at least one semiconductor device and one of the at least one line-level metal wiring structure 80.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 3-12. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
at least one through substrate via (TSV) extending through a semiconductor substrate;
at least one line-level metal wiring structure including an array of cheesing holes and vertically abutting said at least one TSV;
a metal-wire-level dielectric layer laterally abutting said at least one line-level metal wiring structure, wherein said at least one line-level metal wiring structure and said metal-wire-level dielectric layer complementarily fill an entirety of a layer located on said at least one TSV, and wherein an entirety of sidewalls of each of said at least one TSV located in a plane including an interface between said at least one TSV and said at least one line-level metal wiring structure abuts said at least one line-level metal wiring structure; and
a contact-via-level dielectric layer, wherein a bottom surface of said contact-via-level dielectric layer vertically abuts a top surface of said semiconductor substrate, and wherein each of said at least one TSV extends from a top surface of said contact-via-level dielectric layer to a bottom surface of said semiconductor substrate.

2. The semiconductor structure of claim 1, wherein said entirety of sidewalls of said at least one TSV located in said plane does not contact said metal-wire-level dielectric layer.

3. The semiconductor structure of claim 1, wherein each of said at least one TSV includes a seam located at a center portion of a top surface thereof, wherein said at least one line-level metal wiring structure abuts a peripheral portion of a top surface of each of said at least one TSV, and wherein said array of cheesing holes overlies an entirety of said at least one seam.

4. The semiconductor structure of claim 3, wherein each cheesing hole in said array of cheesing holes embeds an isolated portion of said metal-wire-level dielectric layer separating a seam located underneath from said at least one line-level metal wiring structure.

5. The semiconductor structure of claim 3, wherein said at least one line-level metal wiring structure includes another array of cheesing holes embedding an isolated portion of said metal-wire-level dielectric layer and separated from said at least one TSV.

6. The semiconductor structure of claim 5, wherein said other array of cheesing holes is a linear array of cheesing holes located between an area of a TSV and an area of a neighboring TSV.

7. The semiconductor structure of claim 5, wherein said other array of cheesing holes is an array of substantially rectangular cheesing holes located between neighboring pairs of TSVs, wherein a lateral length of said substantially rectangular cheesing hole is greater than, or the same as, a lengthwise dimension of said neighboring pairs of TSVs.

8. The semiconductor structure of claim 3, wherein said at least one TSV is an array of TSVs.

9. The semiconductor structure of claim 8, wherein a set of isolated portions of said metal-wire-level dielectric layer overlies an entirety of seams in said array of TSVs.

10. The semiconductor structure of claim 1, further comprising:
at least one semiconductor device located in said semiconductor substrate; and
at least one substrate contact via embedded in said contact-via-level dielectric layer and vertically abutting said at least one semiconductor device and one of said at least one line-level metal wiring structure.

11. The semiconductor structure of claim 1, wherein each of said at least one TSV comprises a metal or a doped semiconductor material.

12. The semiconductor structure of claim 1, wherein said at least one TSV is an array of through substrate vias (TSVs), wherein each cheesing hole in said array of cheesing holes embeds an isolated portion of said metal-wire-level dielectric layer.

13. The semiconductor structure of claim 12, wherein no portion of said metal-wire-level dielectric layer abuts said array of TSVs.

14. The semiconductor structure of claim 12, wherein said array of cheesing holes is a linear array of cheesing holes located between an area of a TSV and an area of a neighboring TSV.

15. The semiconductor structure of claim 14, wherein each cheesing hole in said linear array of cheesing holes has a substantially square horizontal cross-sectional area.

16. The semiconductor structure of claim 12, wherein said array of cheesing holes includes a substantially rectangular cheesing hole located between an area of a TSV and an area of a neighboring TSV, wherein a lateral length of said substantially rectangular cheesing hole is greater than, or the same as, a lengthwise dimension of said TSV or said neighboring TSV.

17. The semiconductor structure of claim 12, wherein each TSV in said array of TSVs comprises a seam on a top surface thereof, wherein said at least one line-level metal wiring structure overlies an entirety of seams in said array of TSVs.

18. A method of forming a semiconductor structure comprising:
   forming at least one through substrate via (TSV) through a semiconductor substrate;
   forming at least one line-level metal wiring structure including an array of cheesing holes and vertically abutting said at least one TSV;
   forming a layer directly on said at least one TSV;
   forming a metal-wire-level dielectric layer laterally abutting said at least one line-level metal wiring structure, wherein said metal-wire-level dielectric layer and said at least one line-level metal wiring structure complementarily fill an entirety of said layer, wherein an entirety of sidewalls of each of said at least one TSV located in a plane including an interface between said at least one TSV and said at least one line-level metal wiring structure abuts said at least one line-level metal wiring structure; and
   forming a contact-via-level dielectric layer, wherein a bottom surface of said contact-via-level dielectric layer vertically abuts a top surface of said semiconductor substrate, and wherein each of said at least one TSV extends from a top surface of said contact-via-level dielectric layer to a bottom surface of said semiconductor substrate.

19. The method of claim 18, wherein each of said at least one TSV includes a seam located at a center portion of a top surface thereof, wherein said at least one line-level metal wiring structure is formed directly on a peripheral portion of a top surface of each of said at least one TSV, and wherein said array of cheesing holes overlies an entirety of said at least one seam.

20. The method of claim 19, wherein each cheesing hole in said array of cheesing holes embeds an isolated portion of said metal-wire-level dielectric layer separating a seam located underneath from said at least one line-level metal wiring structure.

21. The method of claim 19, wherein said at least one line-level metal wiring structure includes another array of cheesing holes embedding an isolated portion of said metal-wire-level dielectric layer and separated from said at least one TSV.

22. The method of claim 19, wherein said at least one TSV is an array of TSVs, and wherein a set of isolated portions of said metal-wire-level dielectric layer overlies an entirety of seams in said array of TSVs.

23. The method of claim 18, further comprising:
   forming at least one semiconductor device in said semiconductor substrate wherein said contact-via-level dielectric layer is formed on said at least one semiconductor device; and
   forming at least one substrate contact via in said contact-via-level dielectric layer, wherein said at least one substrate contact via vertically abuts said at least one semiconductor device and one of said at least one line-level metal wiring structure.

24. The method of claim 18, wherein said entirety of sidewalls of said at least one TSV is disjoined from said metal-wire-level dielectric layer, and wherein all portions of said metal-wire-level dielectric layer is separated from said array of TSVs by said at least one line-level metal wiring structure.

25. The method of claim 18, wherein said at least one TSV is an array of through substrate vias (TSVs), wherein each cheesing hole in said array of cheesing holes embeds an isolated portion of said metal-wire-level dielectric layer, and wherein said at least one line-level metal wiring structure is formed directly on an entirety of top surfaces of said array of TSVs.

* * * * *